(12) United States Patent
Brodsky et al.

(10) Patent No.: US 7,985,095 B2
(45) Date of Patent: Jul. 26, 2011

(54) IMPLEMENTING ENHANCED CONNECTOR GUIDE BLOCK STRUCTURES FOR ROBUST SMT ASSEMBLY

(75) Inventors: William L. Brodsky, Binghamton, NY (US); John L. Colbert, Byron, MN (US); Mark K. Hoffmeyer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 12/499,913

(22) Filed: Jul. 9, 2009

(65) Prior Publication Data

US 2011/0008994 A1 Jan. 13, 2011

(51) Int. Cl.
*H01R 13/58* (2006.01)
(52) U.S. Cl. .................................... 439/474; 439/947
(58) Field of Classification Search .............. 439/78, 439/83, 84, 474, 947
See application file for complete search history.

(56) References Cited

U.S. PATENT DOCUMENTS

| | | | | |
|---|---|---|---|---|
| 4,790,763 A | * | 12/1988 | Weber et al. | 439/65 |
| 5,611,013 A | * | 3/1997 | Curzio | 385/89 |
| 5,641,291 A | * | 6/1997 | Sueki et al. | 439/83 |
| 5,975,920 A | * | 11/1999 | Oberstarr | 439/83 |
| 6,134,776 A | | 10/2000 | Hoffmeyer | |
| 6,147,485 A | * | 11/2000 | Halliday et al. | 324/756.01 |
| 6,661,102 B1 | * | 12/2003 | Newman et al. | 257/787 |
| 7,435,622 B2 | | 10/2008 | Colbert et al. | |
| 7,517,230 B2 | * | 4/2009 | Colbert et al. | 439/73 |
| 7,606,033 B2 | * | 10/2009 | Colbert et al. | 361/710 |
| 2004/0245623 A1 | * | 12/2004 | Hara et al. | 257/698 |
| 2005/0095884 A1 | * | 5/2005 | Brodsky et al. | 439/91 |
| 2008/0233771 A1 | * | 9/2008 | Colbert et al. | 439/73 |
| 2008/0259572 A1 | * | 10/2008 | Colbert et al. | 361/719 |
| 2011/0008994 A1 | * | 1/2011 | Brodsky et al. | 439/474 |

* cited by examiner

*Primary Examiner* — James Harvey
(74) *Attorney, Agent, or Firm* — Joan Pennington

(57) ABSTRACT

A method and enhanced connector guide block structures implement robust connector assembly including robust Surface Mount Technology (SMT) connector assembly. A connector guide block includes a printed wiring board (PWB) mating face including at least one mounting screw hole provided within a mounting portion for receiving a mounting screw. The connector guide block is assembled with a printed wiring board (PWB) by inserting a respective non-bonding screw through an aligned opening in the PWB into guide block mounting hole and a gap is defined from an upper surface of the PWB below the guide block mounting portion. The gap is filled with an electrically nonconductive underfill material and cured. Another connector guide block structure includes an upper connector guide block portion and a lower connector guide block portion with a gap between the guide block portions filled with a selected electrically nonconductive underfill material and cured.

20 Claims, 12 Drawing Sheets

IMPLEMENTING ENHANCED CONNECTOR GUIDE BLOCK STRUCTURES FOR ROBUST SMT ASSEMBLY

FIELD OF THE INVENTION

The present invention relates generally to electrical connectors, and more particularly, relates to a method and enhanced connector guide block structures for implementing robust Surface Mount Technology (SMT) connector assembly.

DESCRIPTION OF THE RELATED ART

Electronic computing systems often include components mounted on printed wiring boards (PWBs). Backplane systems including daughtercards and backplane boards are interconnected to transfer power and data signals throughout a computing system. A typical connector assembly for backplane systems includes a backplane connector attached respectively to each of a motherboard and daughtercard. The backplane connectors can be joined to one another to electrically connect the motherboard and the daughtercard. Multiple daughter cards typically are connected through a single backplane card and often are oriented at right angles to the backplane card.

Many high performance computer systems and server systems rely on large-scale packaging of multiple high density interconnect modules and printed circuit boards to accommodate efficient interconnection of increasingly complex, high signal speed, integrated circuit devices within a spatial footprint. Surface Mount Technology (SMT) connector components often are used in backplane and other high density interconnect systems.

Considerable design challenges exist for large Surface Mount Technology (SMT) connector components soldered to a printed wiring board (PWB). The SMT connector components must resist, or be shielded from significant external forces that result during assembly, test, and system integration.

Specifically, SMT leads must have good true position and lead coplanarity for successful solder attach, and the connector body must have mechanical support features to resist external forces that arise during various integration steps.

One known high density, SMT connector solution is called Ventura®, a connector manufactured and sold by Amphenol Corporation of Nashua, N.H. This connector technology includes guide blocks designed to align the connector to the board, retain the connector to the PWB post soldering, and resist mating, plus system plugging forces, during functional integration and subsequent system operation. The Ventura connector is assembled from a series of wafers, for example, similar to High Density Metric (VHDM) and other high speed connectors. These wafers are attached to a stainless steel organizer in wafer groups that are separated by guide or joiner blocks. The end guide blocks provide alignment features for the backplane header to plug into, and the in-board joiner blocks provide mechanical attachment points.

Typically individual wafers that make up a connector are comprised of three layers, or wafer sub-component pieces including a signal overmold piece, a shield overmold piece, and a lossy, dielectric wafer. The shield side typically is on top and the signal side on the bottom. For example, SMT leads are positioned between the two wafers in an alternating pattern of shield, signal, shield, signal, shield, and the like, to improve electrical performance of the connector. Since the SMT lead and wafer frames are positioned first into their respective overmolds and then built into a into a wafer, for example, by a mechanical staking operation, there is an accumulation of positional tolerance built up within the individual overmolded subcomponents and the two overmolded subcomponents built into an assembled wafer.

At an assembled connector level, the build up of accumulated tolerances from various connector sub-components can shift nominal intended positions of SMT leads, SMT lead coplanarity, and wafer mating face positions. Factors affecting these shifts include positional tolerances associated with the following connector sub-components and connector assembly steps: SMT lead positions in signal over molds; SMT lead positions in shield over molds; and assembly of signal and shield over molds into wafer format. In addition, subsequent assembly of wafers onto organizer also introduces wafer-to-wafer height variation, which impacts SMT lead coplanarity. Guide blocks, which can be manufactured by a number of manufacturing processes, are then assembled to organizers.

For an assembled connector with SMT leads, there are two substantial tolerance situations: 1) SMT lead coplanarity within the leads; 2) position of connector mounting surfaces to the SMT lead field.

Establishing tight tolerance of the mounting surface to SMT leads is a more difficult attribute to control due to differences in manufacturing processes. As a result, SMT leads need to be set at an elevation that insures SMT soldering, which results in the mechanical support of the connector suffering or actually stressing the SMT joints when the Guide blocks are mechanically restrained and tied down to through the printed circuit board to mechanical stiffening and support elements.

A typical distribution of SMT leads relative to guide blocks and to the PWB surface includes a significant variability. The SMT leads naturally want to sit at a height on the PWB surface driven by the highest combination of SMT lead height and PWB solder pad height. Post SMT soldering, the coplanarity differences between SMT leads and board surfaces drive a gap to form between the PWB and guide blocks. This gap is later closed by pulling the guide blocks to PWB surface during mounting of the card assembly to the mechanical stiffener and support hardware. This overall condition and assembly flow results in application of a compressive stress on SMT leads near guide blocks and a tensile stress on connector wafers in the middle of connector bays due to the nature of organizer loading and deflection.

After the SMT leads are soldered and guide blocks are attached to a PWB surface, the connectors are plugged into a computer system, such as a server system. The plugging process creates an additional stress loading state on the connector, wafers, guide blocks, SMT leads, and the like with the resultant mating forces on the wafers driving the creation of potential tensile stresses on SMT leads and respective solder joints.

In summary, there is a coplanarity tolerance inherent among SMT leads in a large SMT component. Tolerance control of SMT leads to mechanical mounting surfaces may impact SMT solder yields, and lift guide blocks from card surfaces post SMT assembly. Mechanical support of the connector is critical such that the mechanical support elements of the connector can effectively resist externally applied forces and protect SMT lead solder joints from said applied external forces.

Overall, due to the inherent and large amount of coplanarity variability present on large SMT components and their PWB assembly sites, to ensure that mechanical support elements of the connector can effectively resist external applied forces and protect SMT joints, it is desirable to maintain, rigidize, secure and stabilize the inherent position of guide blocks and SMT leads and joints that result on assemblies exiting the SMT assembly process, such that these relative positions remain fixed and are stabilized for subsequent post SMT assembly hardware integration, test, and system integration operations.

SUMMARY OF THE INVENTION

Principal aspects of the present invention are to provide a method and enhanced connector guide block structures for implementing robust connector assembly including, for example, robust Surface Mount Technology (SMT) connector assembly. Other important aspects of the present invention are to provide such method and enhanced connector guide block structures substantially without negative effect and that overcome many of the disadvantages of prior art arrangements.

In brief, methods and processes for creating enhanced connector guide block structures are provided to ensure robust connector assembly and connector mating including, for example, a Surface Mount Technology (SMT) connector assembly. A connector guide block includes a printed wiring board (PWB) mating face including at least one mounting screw hole provided within a mounting portion for receiving a mounting screw. The connector guide block is assembled with a printed wiring board (PWB) by inserting a respective non-bonding screw through an aligned opening in the PWB into guide block mounting hole and a gap is defined from an upper surface of the PWB below the guide block mounting portion. The gap is filled with a selected electrically nonconductive underfill material and cured.

In accordance with features of the invention, the electrically nonconductive underfill material includes an epoxy material with glass filler. The non-binding screw includes a releasable, nonbonding coating, such as, a Teflon® material. The connector guide block includes a connector alignment pad and a connector to PWB alignment pin, which is received within an opening in the PWB.

In accordance with features of the invention, in another embodiment of the invention a pair of vertically moveable slider portions is arranged for sliding up and down within the guide block. A pair of fill ports provide an underfill port to the slider portions for filling the gap between an upper surface of a respective guide block cavity receiving the respective slider portions and the slider portions, which is filled with a selected underfill material. With the slider portions, the underfill material is captivated away from the PWB surface.

In another embodiment of a connector guide block structure, a split connector guide block is provided. The split connector guide block includes upper guide block portions affixed to a connector and independent lower connector guide block portions. The lower connector guide block portions are positioned and aligned relative to a printed wiring board (PWB) by inserting at least one non-bonding screw through a respective aligned opening in the PWB and guide block mounting hole. The PWB is supported on a stiffener. The upper guide block portions are positioned on the lower connector guide block portions that are soldered to the PWB. Gap are defined between the guide block portions and then filled with a selected electrically nonconductive underfill material and cured.

In accordance with features of the invention, the connector guide block structure includes cooperating beveled guide block features for initial seating alignment of the upper connector guide block portion and the lower connector guide block portion.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, enhanced connector guide block structures are provided for implementing robust Surface Mount Technology (SMT) connector assembly and separable interface mating. The enhanced connector guide block structures are configured to maintain, rigidize, secure and stabilize the inherent position of guide blocks and SMT leads and joints that result on assemblies exiting an SMT assembly process, such that these relative positions remain fixed and are stabilized for subsequent post SMT assembly hardware integration, test, and system integration operations.

Figure 1:
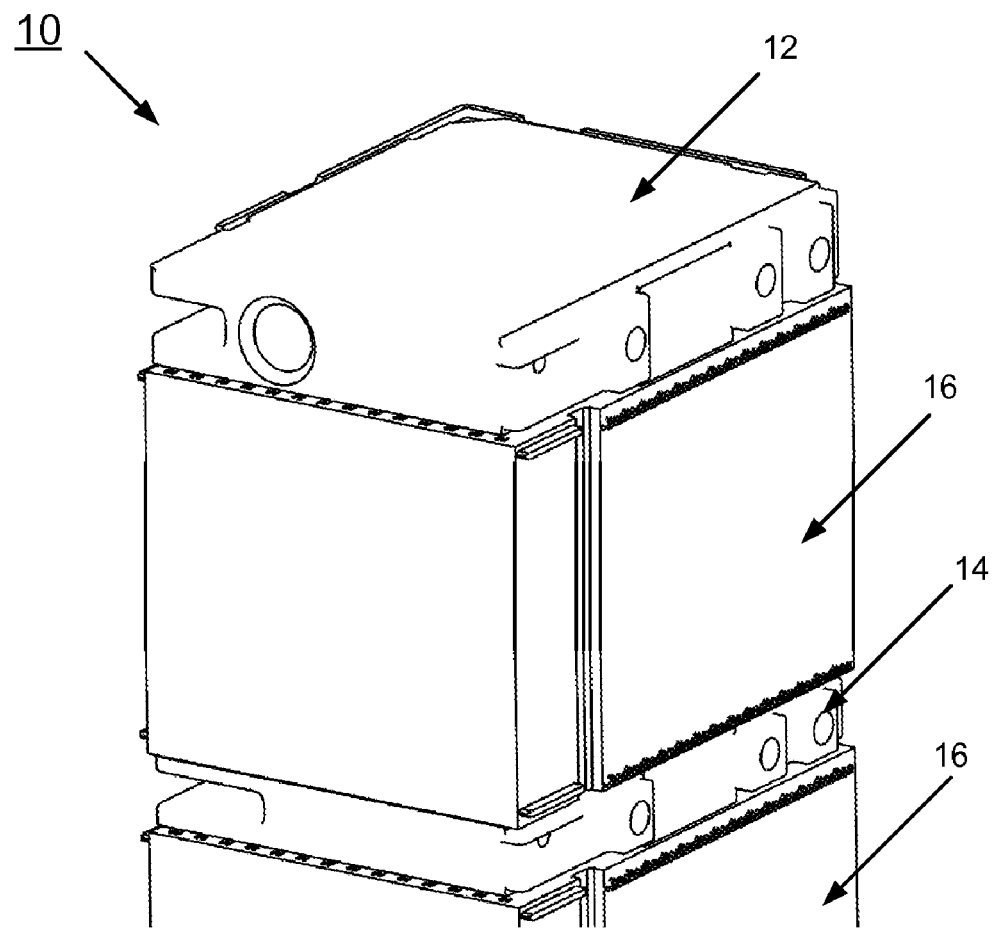
FIG. 1 is a fragmentary perspective view partially schematic not to scale of an example Surface Mount Technology (SMT) connector assembly including a connector guide block in accordance with a preferred embodiment.

Having reference now to the drawings, in FIG. 1, there is shown a fragmentary perspective view partially schematic not to scale of an example Surface Mount Technology (SMT) connector assembly generally designated by the reference character 10 including a connector guide block in accordance with a preferred embodiment. As shown in FIG. 1, the SMT connector assembly 10 includes a connector guide block 12 (one shown) on each end and an interior connector guide block 14 or multiple interior connector guide blocks 14.

As shown in FIG. 1, the SMT connector assembly 10 includes a connector section 16 attached to the end connector guide block 12 and the interior connector guide block 14. A fragmentary portion of a second connector section 16 is shown attached to the interior connector guide block 14.

In accordance with features of the invention, the end connector guide block 12 and the interior connector guide block 14 advantageously are arranged in accordance with preferred embodiments of the invention.

Figure 2A:
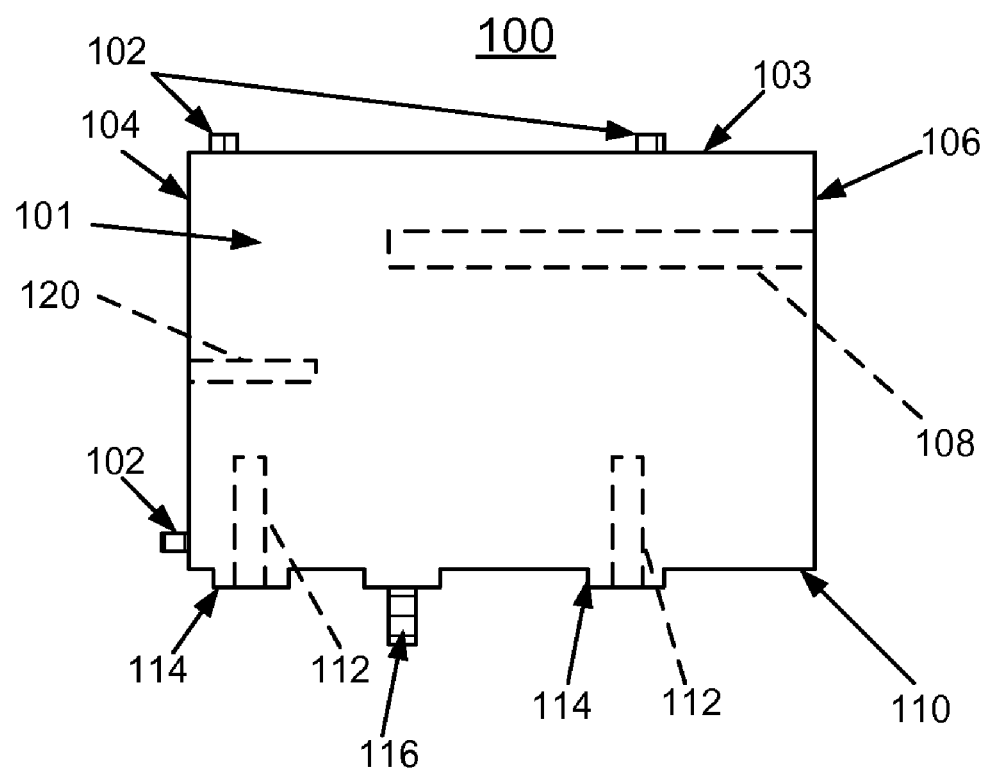
FIG. 2A is a side view partially schematic not to scale of a connector guide block in accordance with a preferred embodiment.

Referring now to FIG. 2A, there is shown a connector guide block generally designated by the reference character 100 in accordance with one preferred embodiment.

The connector guide block 100 includes a generally rectangular block 101 with a plurality of wafer to organizer alignment features 102 along a first two sides 103,104 of the connector guide block 100. The connector guide block 100 includes a third side 106 including a guide pin hole 108 shown in dashed line for mating and positioning with a mating and positioning connector guide pin (not shown). The connector guide block 100 includes a printed wiring board (PWB) mating face 110 including a pair of mounting screw holes 112 shown in dashed line provided within a respective downwardly extending mounting pad or seating foot 114. The connector guide block 100 includes a connector alignment pad with a connector to PWB alignment pin 116, which is received within an opening in the PWB for conventional function for connector alignment positioning.

Figure 2B:
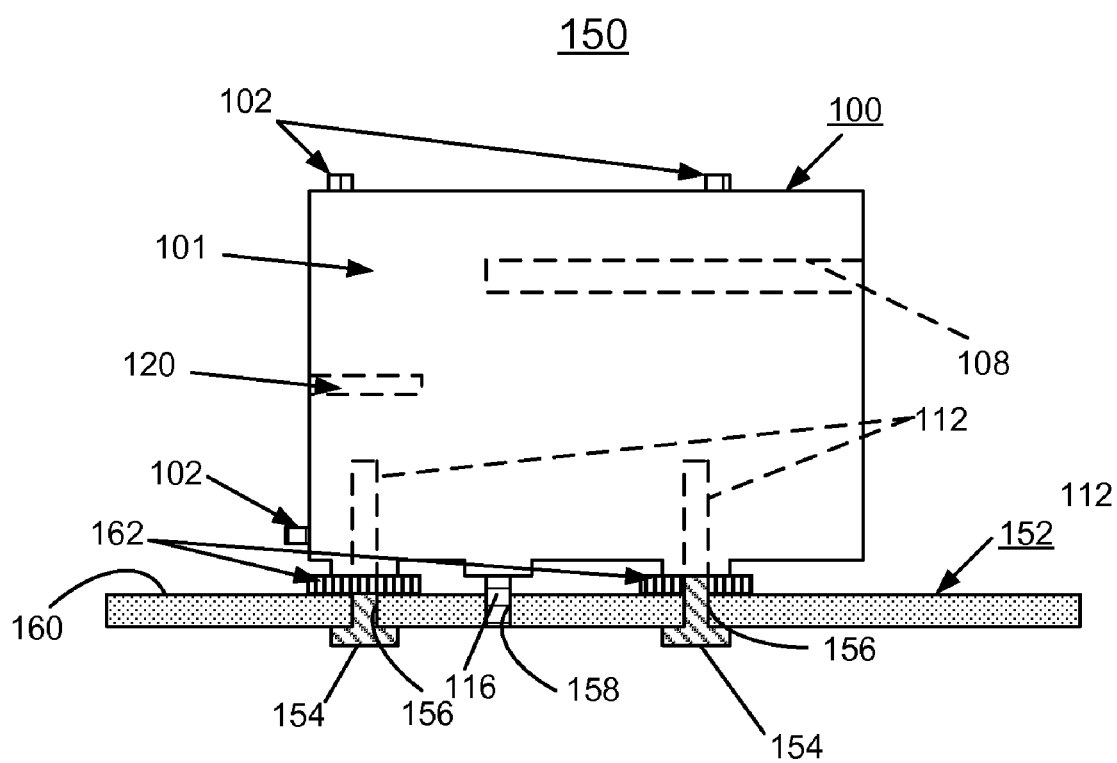
FIG. 2B is a side view, partially in section, partially schematic not to scale of a connector guide block structure including the connector guide block of FIG. 2A in accordance with a preferred embodiment.

Referring also to FIG. 2B, there is shown a connector guide block structure generally designated by the reference character 150 in accordance with one preferred embodiment. The connector guide block structure 150 is configured using available connectors and known assembly process including the connector guide block 100 with underfill provided at guide block mounting pads 114.

In accordance with features of the invention, the connector guide block structure 150 includes the connector guide block 100 assembled with a printed wiring board (PWB) 152 by inserting a respective non-bonding screw 154 through an opening 156 in the PWB 152 into guide block mounting holes 112 with the connector to PWB alignment pin 116 received within an opening 158 in the PWB 152. The non-binding screw 154 includes a releasable, nonbonding coating, such as a Teflon® material.

Next a respective gap from an SMT attach surface 160 on the PWB 152 below the guide block mounting pads 114 is filled with a selected underfill material 162. The underfill material 162 is an electrically nonconductive material, such as an epoxy material with glass filler. The underfill material 162 is cured for a predefined rest period. Heat or ultraviolet (UV) cure also optionally can be provided. Next the non-bonding screws 154 are removed and the node or board assembly process is completed.

In accordance with features of the invention, the connector guide block structure 150 can be performed with present hardware, while is required care not to underfill SMT leads and modify SMT stress state. The connector guide block structure 150 provides mechanical support of a SMT connector assembly to effectively resist externally applied forces and protect SMT lead solder joints from such applied external forces.

A disadvantage of the connector guide block structure 150 is that the connector and PWB configuration is not reworkable, while rework presently is not used on conventional Ventura connectors.

Figure 2C:
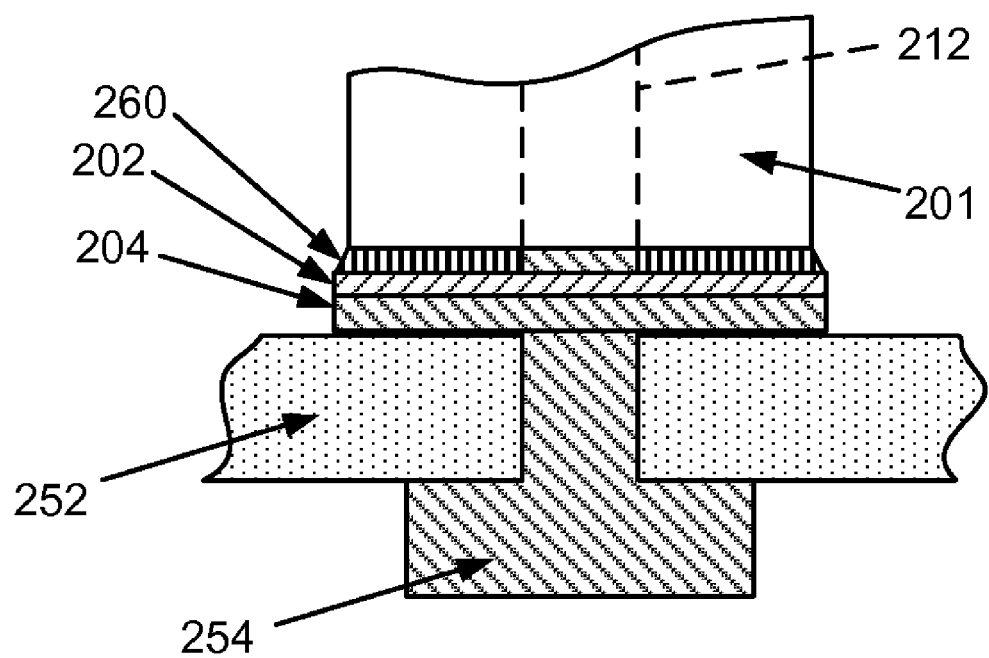
FIG. 2C is a side view, partially in section, partially schematic not to scale of an alternative connector guide block structure including the connector guide block of FIG. 2A in accordance with a preferred embodiment.

Referring now to FIG. 2, there is shown an alternative connector guide block structure generally designated by the reference character 200 in accordance with one preferred embodiment. The connector guide block structure 200 includes the connector guide block 100 or a similar connector guide block using available connectors and known assembly process.

In the alternate embodiment of connector guide block structure 200, a fusible layer or solder release layer 202 advantageously is applied to card mounting pad surfaces 204 on a printed wiring board (PWB) 252 that support the generally rectangular connector guide block 201 during solder paste application steps. An underfill material layer 260 is applied between the fusible layer 202 and the connector guide block 201. The underfill material layer 260 is an electrically nonconductive material, such as an epoxy material with glass filler. The underfill material 260 is cured for a predefined rest period. Heat or ultraviolet (UV) cure also optionally can be provided.

The fusible layer 202 can have a common melting temperature range to solders used for connector SMT assembly, or it may optionally have a lower melting temperature range than solders used for the SMT connector with the connector guide block structure 200. The fusible layer 202 is melted to facilitate separation of underfill layer 260 and guide block feet from the PWB pad surfaces 204 to enable connector rework.

Similar methods have been used to facilitate rework of heatsink and packaging structures, such as disclosed in U.S. Pat. No. 6,134,776 issued Oct. 24, 2000 to Mark Kenneth Hoffmeyer and assigned to the present assignee; and disclosed in U.S. Pat. No. 7,435,622 issued Oct. 14, 2008 to John Lee Colbert and Mark Kenneth Hoffmeyer and assigned to the present assignee. The subject matter of each of the above-identified patents is incorporated herein by reference.

Figure 3A:
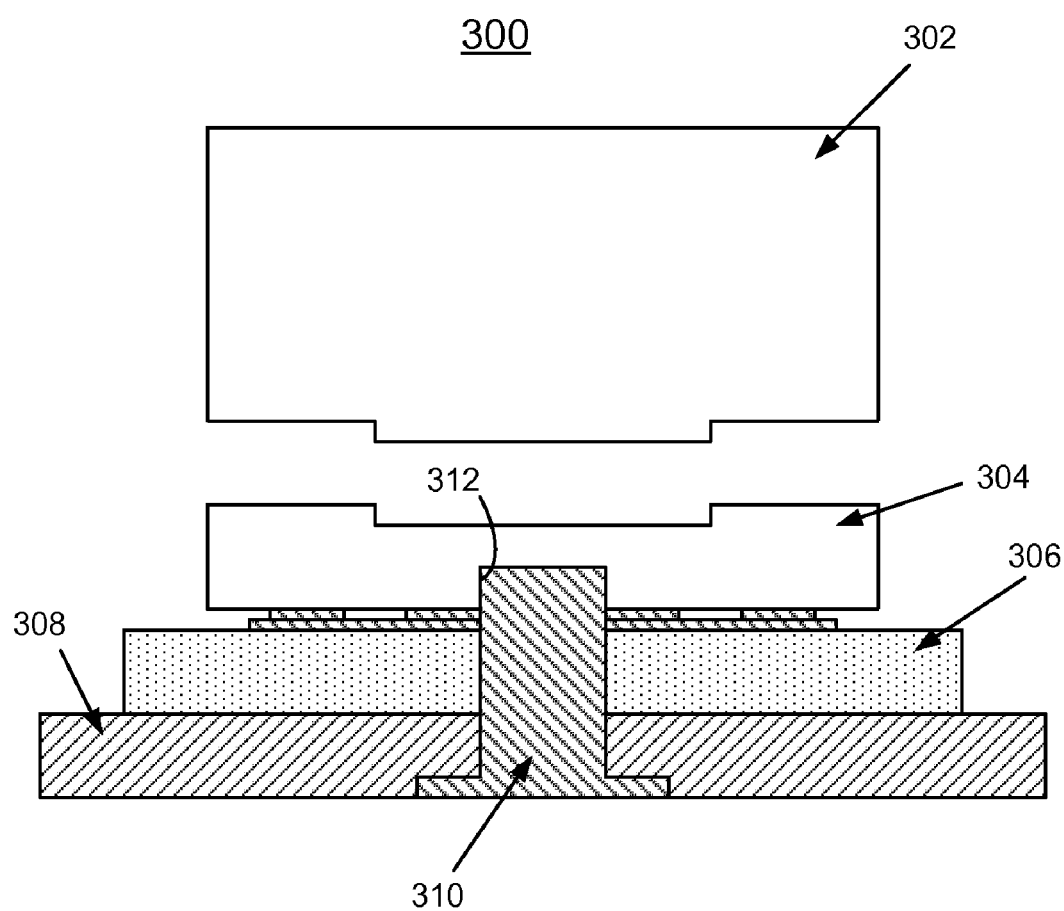
FIGS. 3A, 3B, and 3C are respective side views, partially in section, partially schematic not to scale of another alternative connector guide block structure in accordance with a preferred embodiment.
Figure 3B:
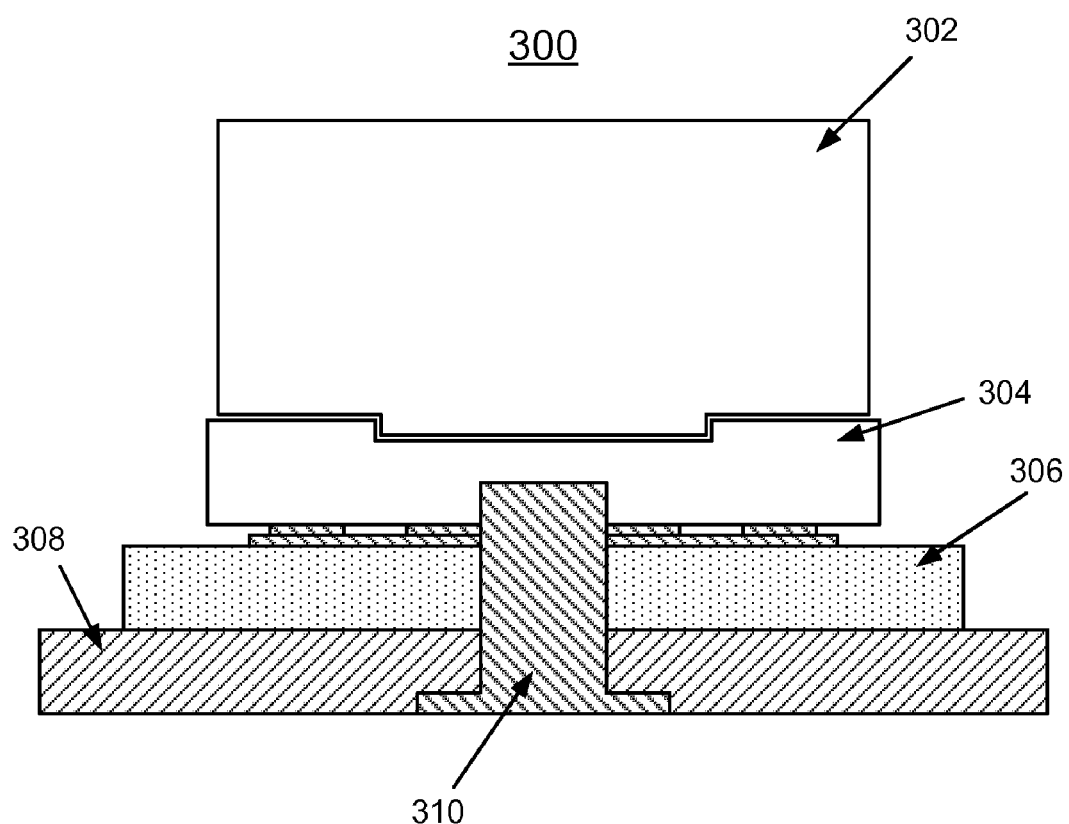
Figure 3C:
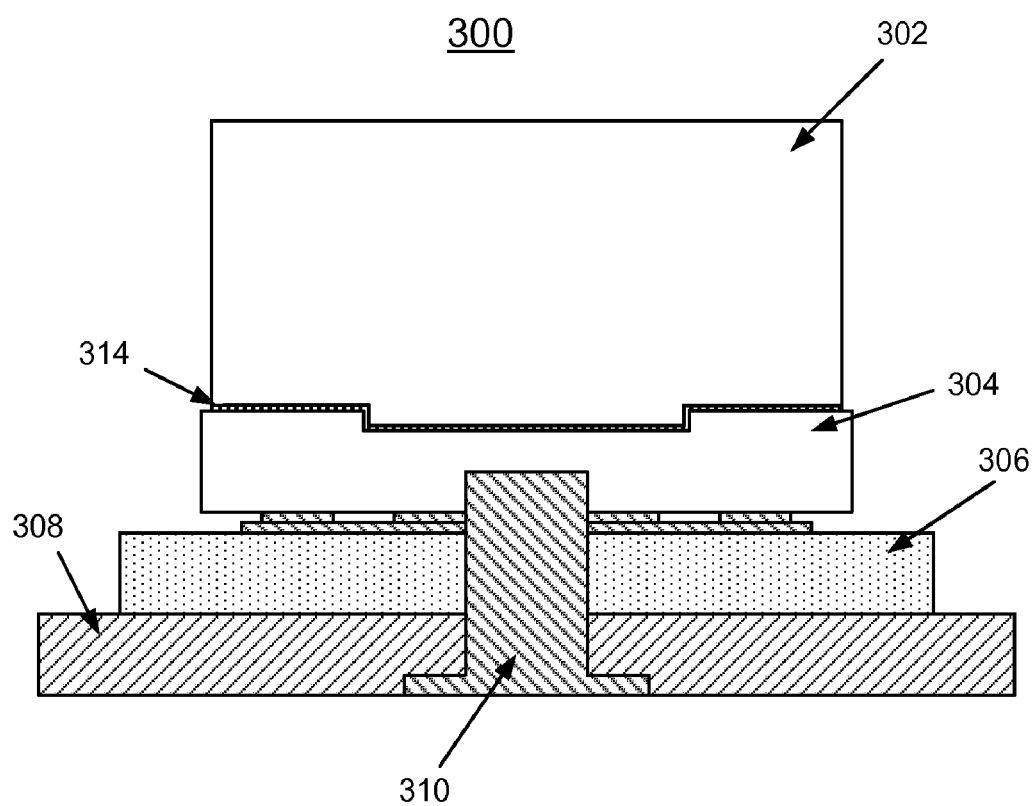

Referring now to FIGS. 3A, 3B, and 3C, there is shown an alternative connector guide block structure generally designated by the reference character 300 in accordance with one preferred embodiment.

The connector guide block structure 300 includes a modified or split connector guide block defined by an upper connector guide block portion 302 and a lower connector guide block portion 304. The lower connector guide block portion 304 is positioned and aligned relative to a printed wiring board (PWB) 306, which is supported on a stiffener 308.

In FIG. 3A, a before SMT assembly or pre-SMT assembly is shown. The lower connector guide block portion 304 is assembled with the PWB 306 by inserting a non-bonding screw 310 through an aligned mounting screw opening 312 extending through the stiffener 308 and the PWB 306 into the lower connector guide block portion 304. The non-binding screw 310 includes a releasable, nonbonding coating, such as a Teflon® material.

In FIG. 3B, an SMT assembly of the connector guide block structure 300 is shown with the top or upper connector guide block portion 302 supported and positioned with the lower connector guide block portion 304. The then SMT leads of the SMT assembly are soldered.

In FIG. 3C, a post SMT assembly of the connector guide block structure 300 is shown. A mating interface between the upper connector guide block portion 302 and the lower connector guide block portion 304 is filled with an underfill material 314. Then the underfill material 314 is cured, and the node or board assembly process is completed. The underfill material 314 is an electrically nonconductive material, such as an epoxy material with glass filler. The underfill material 314 is cured for a predefined rest period. Heat or ultraviolet (UV) cure also optionally can be provided.

In accordance with features of the invention, the connector guide block structure 300 can be configured using present or similar connector alignment methodology and features. The connector guide block structure 300 supports connector and PWB rework and provides mechanical support of a SMT connector assembly to effectively resist externally applied forces and protect SMT lead solder joints from such applied external forces.

A disadvantage of the connector guide block structure 300 is that mechanical attach of the upper connector guide block portion 302 and the lower connector guide block portion 304 is required before SMT assembly.

Figure 4A:
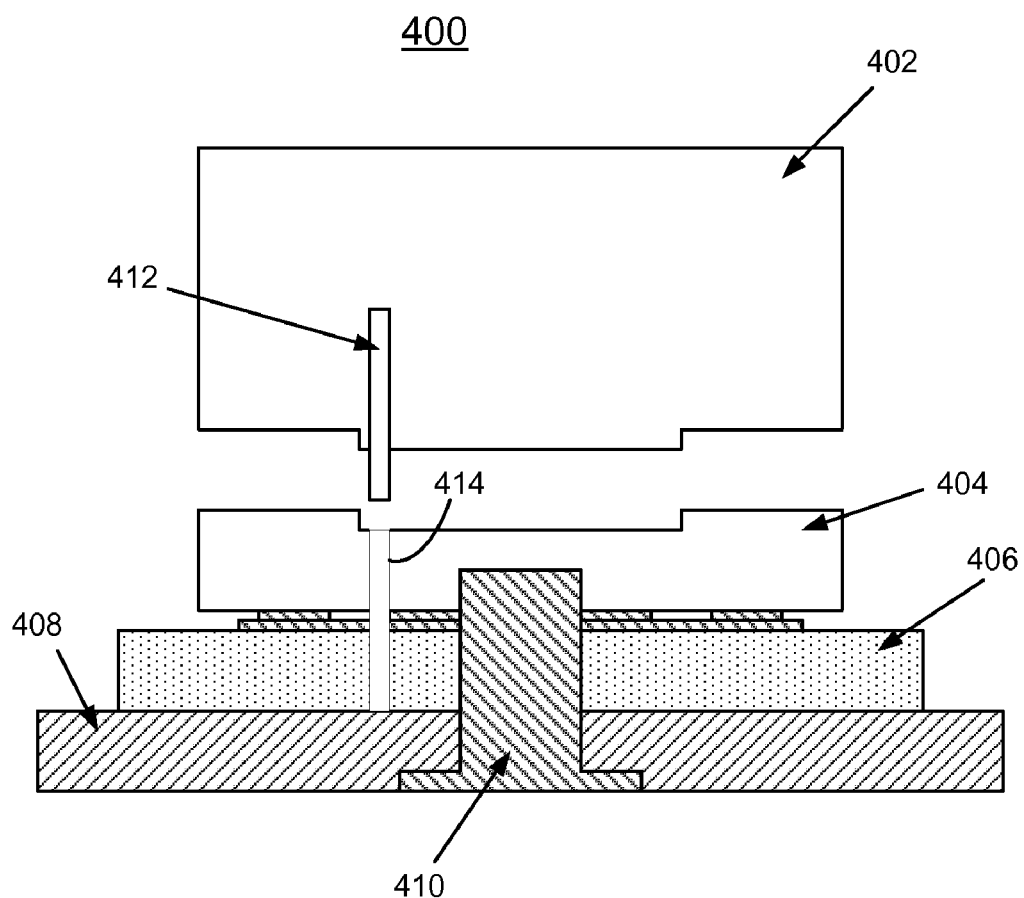
FIGS. 4A, and 4B are respective side and front views, partially in section, partially schematic not to scale of yet another alternative connector guide block structure in accordance with a preferred embodiment.
Figure 4B:
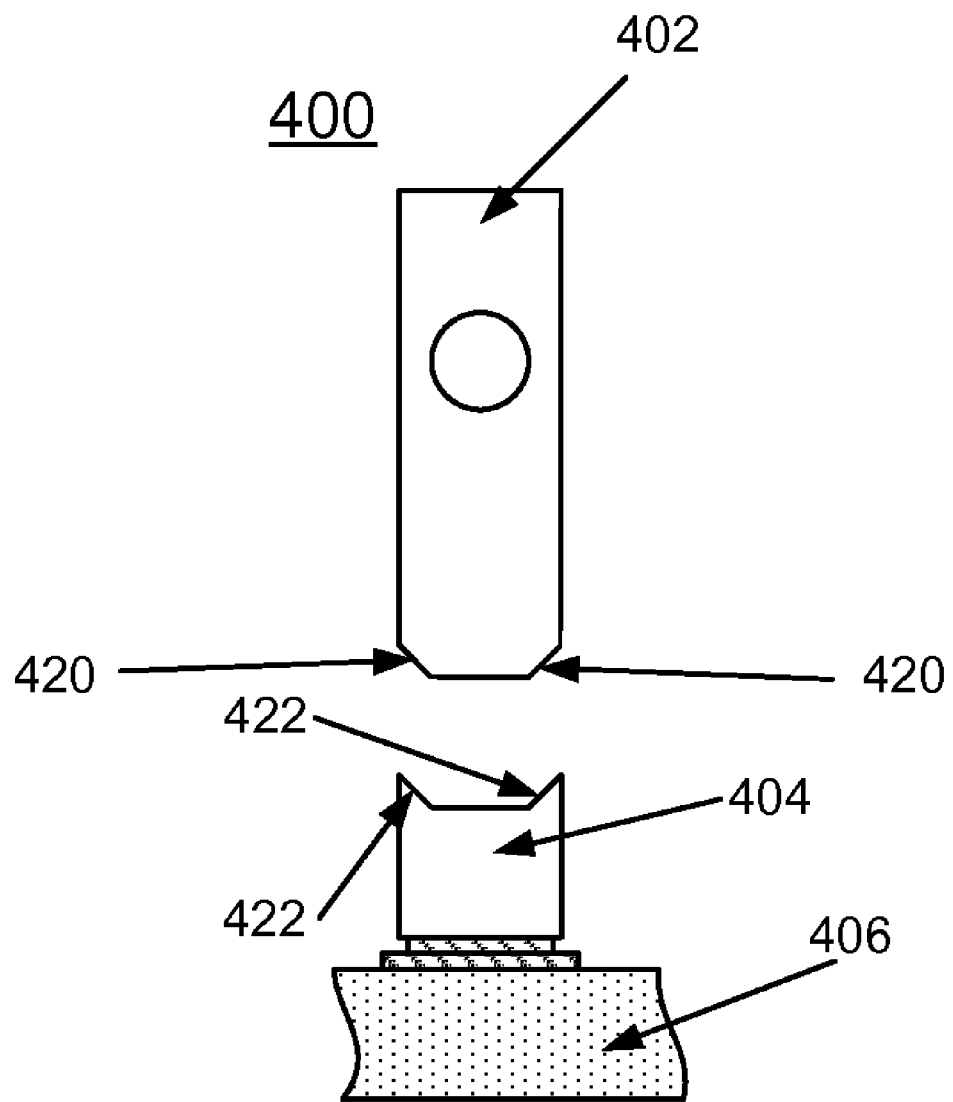

Referring now to FIGS. 4A, and 4B, there is shown an alternative connector guide block structure generally designated by the reference character 400 in accordance with one preferred embodiment.

The connector guide block structure 400 includes a modified or split connector guide block defined by an upper connector guide block portion 402 and a lower connector guide block portion 404. The lower connector guide block portion 404 is positioned and aligned relative to a printed wiring board (PWB) 406, which is supported on a stiffener 408. The lower connector guide block portion 404 is assembled with the PWB 406 by inserting a non-bonding screw 410 through the stiffener 408 and the PWB 406 into the lower connector guide block portion 404. The non-binding screw 310 includes a releasable, nonbonding coating, such as a Teflon® material.

In accordance with features of the invention, the connector guide block structure 400 includes an alignment pin or dowel pin 412 received within a cooperating aperture 414 defined within the lower connector guide block portion and the PWB 406. The lower connector guide block portion 404 is aligned with the PWB 406 via the dowel pin 412.

In accordance with features of the invention, the connector guide block structure 400 includes cooperating beveled guide block features 420 and 422 for initial seating alignment of the upper connector guide block portion 402 and the lower connector guide block portion 404 as illustrated in FIG. 4B.

Figure 5A:
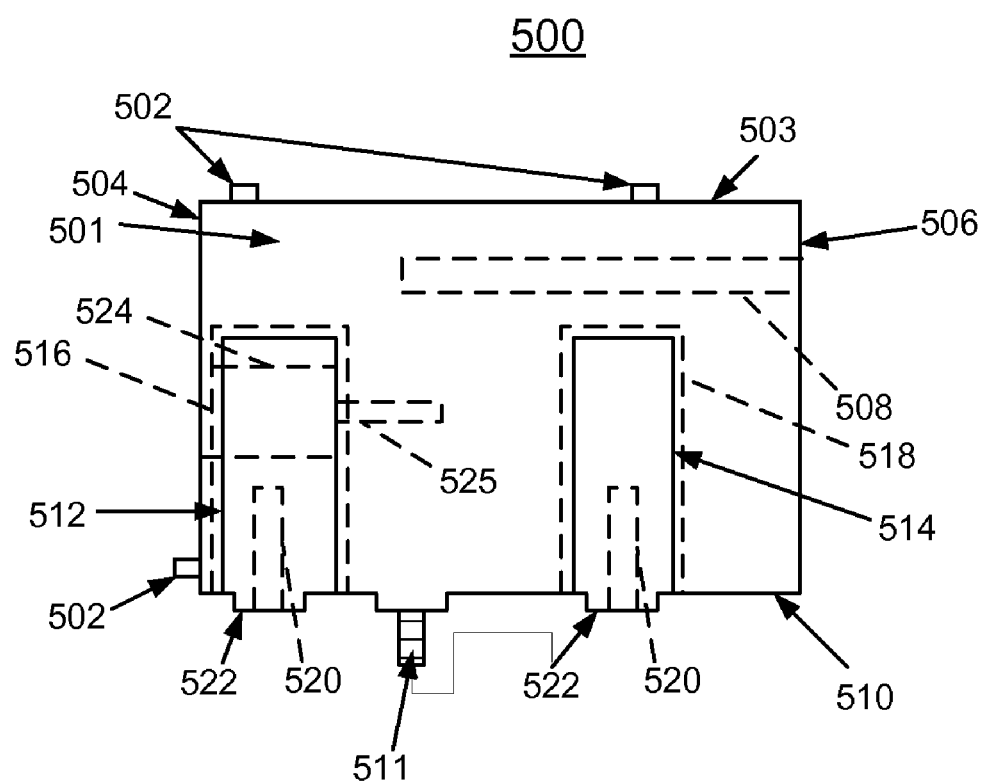
FIGS. 5A, 5B, and 5C are a first side view, a second side view partially in section, and an end view, partially schematic not to scale, of a further alternative connector guide block structure in accordance with a preferred embodiment.
Figure 5B:
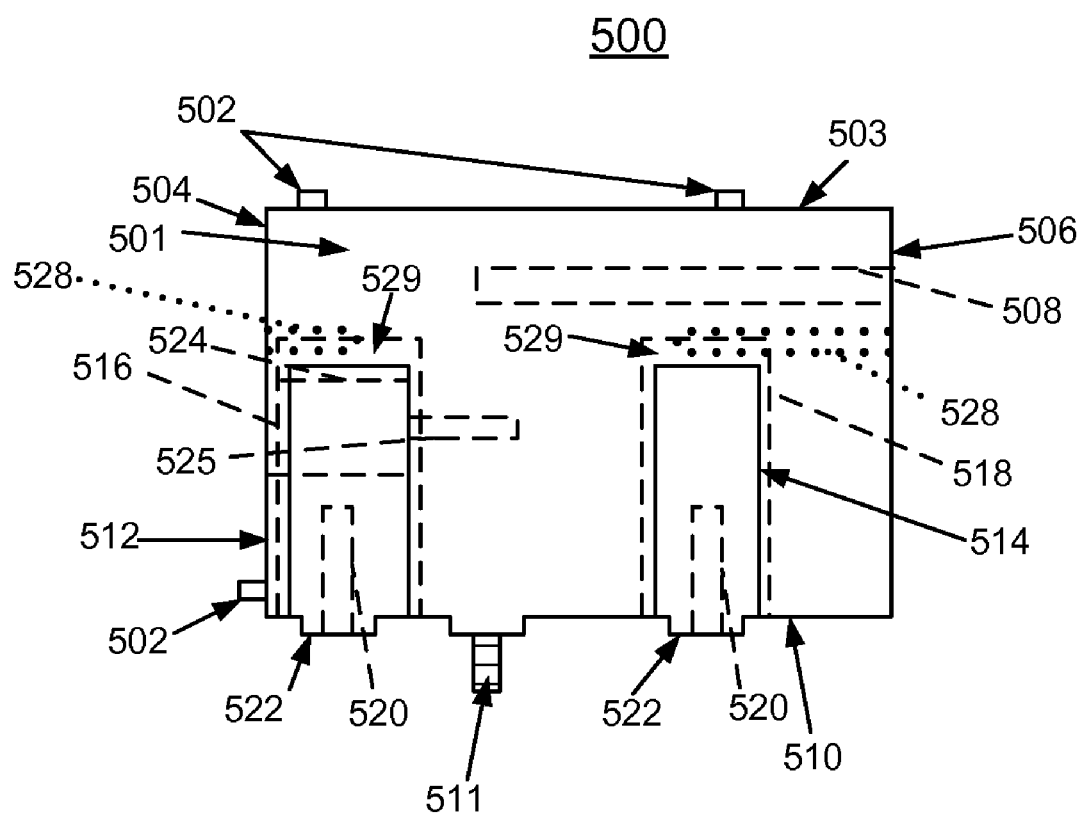
Figure 5C:
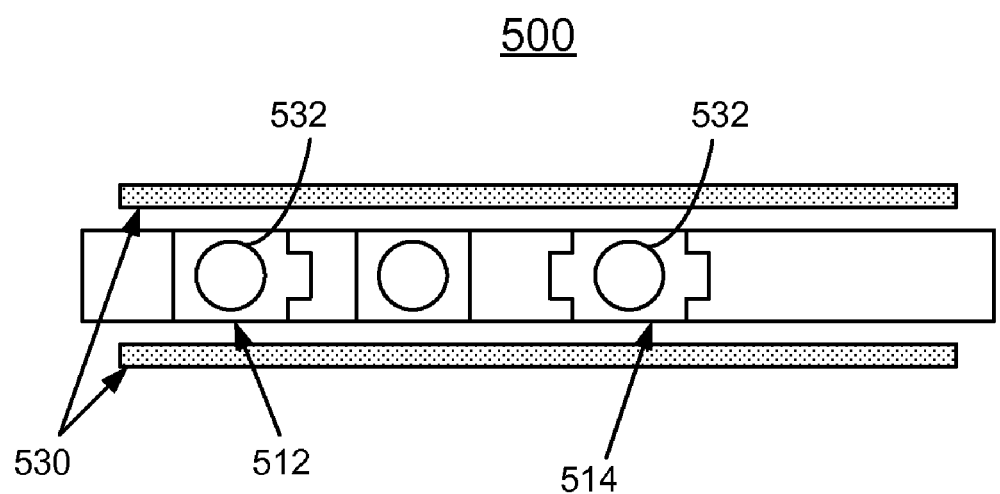

Referring now to FIGS. 5A, 5B, and 5C, there is shown another alternative connector guide block structure generally designated by the reference character 500 in accordance with one preferred embodiment.

The connector guide block structure 500 includes a generally rectangular connector guide block 501 with a plurality of wafer to organizer alignment features 502 along a first two sides 503, 504 of the connector guide block structure 500. The connector guide block structure 500 includes a third side 506 including a guide pin opening 508 shown in dashed line for mating and positioning with a mating and positioning connector guide pin (not shown). The connector guide block structure 500 includes a printed wiring board (PWB) mating face 510.

The connector guide block structure 500 includes a connector alignment pad with a connector to PWB alignment pin 511, which is received within an opening in the PWB providing the conventional function for connector alignment positioning. The connector guide block structure 500 aligns the associated connector to SMT pads using the known guide pin alignment system, such as shown in FIG. 2B.

In accordance with features of the invention, the connector guide block structure 500 includes a pair of slider portions 512, 514 arranged for sliding up and down, respectively received within a respective aperture or cavity 516, 518 formed in the guide block 501.

The slider portions 512, 514 include a respective mounting screw hole 520 shown in dashed line provided within a respective downwardly extending mounting pad or seating foot 522. The connector guide block 501 includes a clearance section with a pair of offset holes 524, 525 shown in dotted line proximate to the slider cavity 516 for receiving an organizer retaining screw (not shown).

During assembly, the slider portions 512, 514 are moved up and held by an adhesive tape, such as shown in FIG. 5C. The associated connector SMT leads are soldered. Then the sliders 512, 514 are moved downwardly to engage the PWB (not shown).

As shown in FIG. 5B, a pair of fill ports 528 shown in dotted line provide an underfill port to the sliders 512, 514 for filling a gap between an upper portion 529 of the respective cavities 516, 518 and the tops of the sliders 512, 514, which is filled with a selected underfill material. Then the underfill material is cured, and the node or board assembly process is completed. The underfill material is captivated away from the PWB surface with the sliders 526.

As shown in FIG. 5C, an adhesive tape 530 holds the sliders 512, 514 in place during reflow. The connector to PWB alignment pin 511 is received within an opening in the PWB and the sliders 512, 514 are raised from the alignment pin pad during original assembly and are lowered to the PWB after assembly. A mounting screw (not shown), such as the mounting screw 154 shown in FIG. 2B with the connector guide block structure 150, is received within opening 532 to pull the sliders 512, 514 to the PWB after attach. The sliders 512, 514 are lowered and locked vertically in position enabling longer connector term life.

In accordance with features of the invention, the connector guide block structure 500 can be can be configured using present or similar connector alignment methodology and features with the connector guide block modified to include the sliders 512, 514. The connector guide block structure 500 includes the fully integrated, adjustable guide block. The connector guide block structure 500 supports connector and PWB rework and provides mechanical support of a SMT connector assembly to effectively resist externally applied forces and protect SMT lead solder joints from such applied external forces.

While the present invention has been described with reference to the details of the embodiments of the invention shown in the drawing, these details are not intended to limit the scope of the invention as claimed in the appended claims.

What is claimed is:

1. A connector guide block structure for implementing a robust connector assembly comprising:
   a connector guide block, said connector guide block including a printed wiring board (PWB) mating face;
   said PWB mating face including a mounting portion and at least one mounting screw hole provided within said mounting portion for receiving a mounting screw to assemble said connector guide block with a printed wiring board (PWB);
   an electrically nonconductive underfill material layer, said electrically nonconductive underfill material layer disposed within a gap defined between an upper surface of the PWB below the guide block mounting portion.

2. The connector guide block structure as recited in claim 1 wherein said electrically nonconductive underfill material layer includes an epoxy material with glass filler.

3. The connector guide block structure as recited in claim 1 wherein said mounting screw includes a non-binding screw for assembling said connector guide block with said printed wiring board (PWB), said non-binding screw includes a releasable, nonbonding coating.

4. The connector guide block structure as recited in claim 1 wherein said connector guide block includes a connector alignment pad and a connector to PWB alignment pin, said connector to PWB alignment pin is received within an opening in the PWB.

5. The connector guide block structure as recited in claim 1 includes a fusible coating applied to an electrical mounting pad on said PWB, said electrically nonconductive underfill material layer disposed on said fusible coating.

6. A connector guide block structure for implementing a robust connector assembly comprising:
a connector guide block, said connector guide block including a printed wiring board (PWB) mating face;
said PWB mating face including a mounting portion and at least one mounting screw hole provided within said mounting portion for receiving a mounting screw to assemble said connector guide block with a printed wiring board (PWB);
a pair of vertically moveable slider portions, said slider portions being arranged for sliding up and down within a respective cavity formed in said connector guide block;
an electrically nonconductive underfill material layer, said electrically nonconductive underfill material layer disposed within a gap defined between an upper surface of the slider portions and an upper portion of each respective cavity with the slider portions moved down.

7. The connector guide block structure as recited in claim 6 includes a pair of fill ports providing an underfill port to said slider portions for filling the gap between an upper surface of a PWB below the guide block mounting pads with an electrically nonconductive underfill material defining said electrically nonconductive underfill material layer.

8. The connector guide block structure as recited in claim 6 wherein said connector guide block includes a connector alignment pad and a connector to PWB alignment pin, said connector to PWB alignment pin is received within an opening in the PWB and wherein said slider portions are raised from said alignment pin pad during original assembly.

9. The connector guide block structure as recited in claim 6 wherein said connector guide block includes a plurality of wafers to organizer alignment features.

10. A connector guide block structure for implementing a robust connector assembly comprising:
a split connector guide block; said split connector guide block including an upper connector guide block portion and a lower connector guide block portion; said lower connector guide block portion being positioned and aligned relative to a printed wiring board (PWB); said upper connector guide block portion being positioned on said lower connector guide block portion with a gap defined between the guide block portions;
a stiffener, said PWB mounted on said stiffener; and
an electrically nonconductive underfill material layer, said electrically nonconductive underfill material layer disposed within said gap between the guide block portions.

11. The connector guide block structure as recited in claim 10 wherein said electrically nonconductive underfill material layer includes an epoxy material with glass filler.

12. The connector guide block structure as recited in claim 10 includes a non-binding screw for assembling said lower connector guide block portion with said printed wiring board (PWB), said non-binding screw includes a releasable, non-bonding coating.

13. The connector guide block structure as recited in claim 12 wherein said non-binding screw is a mounting screw received within an aligned opening in said PWB and said stiffener into said lower connector guide block portion.

14. The connector guide block structure as recited in claim 10 wherein said upper connector guide block portion and said lower connector guide block portion include cooperating beveled guide block features for initial seating alignment of said upper connector guide block portion and said lower connector guide block portion.

15. A method for making a connector guide block structure for robust connector assembly comprising the steps of:
providing a connector guide block, said connector guide block including a printed wiring board (PWB) mating face; said PWB mating face including a mounting portion and at least one mounting screw hole provided within said mounting portion for receiving a mounting screw to assemble said connector guide block with a printed wiring board (PWB);
assembling said connector guide block with said printed wiring board (PWB) and defining a gap for receiving an electrically nonconductive underfill material;
depositing an electrically nonconductive underfill material within said gap; and
curing said electrically nonconductive underfill material to form an electrically nonconductive underfill material layer.

16. The method for making a connector guide block structure as recited in claim 15 includes curing said electrically nonconductive underfill material for a selected rest period.

17. The method for making a connector guide block structure as recited in claim 15 wherein assembling said connector guide block with said printed wiring board (PWB) and defining said gap for receiving an electrically nonconductive underfill material includes defining a gap between an upper surface of the PWB below the guide block mounting portion.

18. The method for making a connector guide block structure as recited in claim 15 wherein said connector guide block includes an upper connector guide block portion and a lower connector guide block portion; said lower connector guide block portion being positioned and aligned relative to a printed wiring board (PWB); said upper connector guide block portion being positioned on said lower connector guide block portion and wherein assembling said connector guide block with said printed wiring board (PWB) and defining said gap for receiving an electrically nonconductive underfill material includes defining a gap between said upper guide block portion and said lower guide block portion.

19. The method for making a connector guide block structure as recited in claim 15 includes providing said connector guide block with a pair of vertically moveable slider portions, said slider portions being arranged for sliding up and down within a respective cavity formed in said connector guide block, and providing said connector guide block with a pair of fill ports for providing an underfill port to said slider portions for filling said gap with said electrically nonconductive underfill material; and said gap defined between an upper surface of the slider portions and an upper portion of each respective cavity with the slider portions moved down.

20. The method for making a connector guide block structure as recited in claim 15 includes forming a solder release layer on the PWB, and wherein depositing said electrically nonconductive underfill material within said gap includes depositing an electrically nonconductive underfill material on said solder release layer.

* * * * *